United States Patent [19]

Ham

[11] Patent Number: 5,582,938

[45] Date of Patent: Dec. 10, 1996

[54] PHASE SHIFT MASK

[75] Inventor: Young M. Ham, Bubaleub, Rep. of Korea

[73] Assignee: Hyundai Electronics Industries Co., Ltd., Rep. of Korea

[21] Appl. No.: 407,868

[22] Filed: Mar. 21, 1995

[30] Foreign Application Priority Data

Mar. 21, 1994 [KR] Rep. of Korea .................. 1994-5662

[51] Int. Cl.$^6$ ..................................... G03F 9/00
[52] U.S. Cl. ................... 430/5; 430/322; 430/394
[58] Field of Search ................. 430/5, 322, 394

[56] References Cited

U.S. PATENT DOCUMENTS

| 5,424,154 | 6/1995 | Borodovsky | 430/5 |
| 5,427,876 | 6/1995 | Miyazaki et al. | 430/5 |
| 5,429,897 | 7/1995 | Yoshioka et al. | 430/5 |

*Primary Examiner*—S. Rosasco
*Attorney, Agent, or Firm*—Merchant, Gould, Smith, Edell, Welter & Schmidt

[57] ABSTRACT

A phase shift mask capable of preventing the formation of a ghost image caused by diffraction and interference of light with the phase of 0° and light with the phase of 180° meeting upon forming a pattern by use of the mask of the Half-tone type mask. The phase shift mask includes a photoresist film pattern having a light transmitting portion and a light shielding portion, a phase shift layer adapted to shift the phase of light passing through the light shielding portion of the photoresist film pattern, and an assistant pattern adapted to remove unnecessary components of a main waveform of the light, which components are formed due to the diffraction of light at opposite sides of the main light waveform, the assistant pattern being comprised of a light transmitting portion for shifting the phase of a light incident thereon to 0°.

3 Claims, 4 Drawing Sheets

PHASE SHIFT MASK

BACKGROUND OF THE INVENTION

1. Field of the Invention

The present invention relates to a photo mask to be used for a lithography process for transferring a pattern onto a wafer in fabrication of a semiconductor device, and more particularly to a phase shift mask having a phase shift layer for generating a phase shift.

2. Description of the Prior Art

A phase shift type of mask is the mask used applied to obtain an improved lithography effect over the resolution and depth of focus produced by conventional lithography equipment by virtue of the phase difference between adjacent patterns. Much research on phase shift masks has been performed in many countries in order to obtain the lithography effect. Subsequent developments for the application of a phase shift mask to the fabrication of a semiconductor device are also expected.

Various types of phase shift masks have been known. They have advantages and disadvantages in accordance with their characteristics.

FIG. 1 is a sectional view illustrating a conventional Half-tone phase shift mask. FIG. 2A is a diagram illustrating the distribution of an electric field established just after light passes through the phase shift mask of FIG. 1. FIG. 2B is a diagram illustrating the distribution of the electric field established when the light passing through the phase shift mask of FIG. 1 reaches a wafer. FIG. 2C is a diagram illustrating the distribution of exposure energy established when the light passing through the phase shift mask of FIG. 1 reaches the wafer. FIG. 2D shows a sectional view of a photoresist film pattern formed on the wafer. A phase shift mask having a conventional structure will be described in brief, in conjunction with FIG. 1 and FIGS. 2A to 2D. In FIGS. 1 to 2D, the reference numeral 5 denotes a photoresist film pattern while the reference numeral 4 denotes a wafer.

As shown in FIG. 1, the conventional phase shift mask of the Half-tone type includes a quartz substrate 1, a chromium film 2 coated on the quartz substrate 1, and a phase shifter 3 made of a spin-on-glass (SOG) or polymethylmethacrylate (PMMA) coated over the chromium film 2. The phase shifter 3 may alternatively be interposed between the quartz substrate 1 and the chromium film 2. The chromium of the Half-tone phase shift mask serves to transmit light in some degree, for example, about 10%, as compared to existing masks and other types of phase shift masks. As the transmitted light passes through the phase shifter, it experience a phase shift of 180° relative to light passing through peripheral patterns. As a result, an enhancement in depth of focus and resolution can be obtained. Such a Half-tone mask has a good future prospect because it is fabricated using the same pattern as that used for the existing pattern design and its fabrication is very simple.

In the case of the Half-tone mask shown in FIG. 1, light incident on the mask is decreased in strength and phase shifted by 180° as it passes through a region where the chromium and phase shifter are disposed. On the other hand, light passing through only the quartz is not subjected to any decrease in strength and experiences a phase shift of 0°.

The distribution of the electric field established just after the light passes through the phase shift mask of FIG. 1 is shown in FIG. 2A. On the other hand, the distribution of the electric field established when the light passing through the phase shift mask of FIG. 1 reaches a wafer is shown in FIG. 2B.

FIG. 2C is a diagram illustrating the distribution of an exposure energy established when the light passing through the phase shift mask of FIG. 1 reaches the wafer. It is found that some degree of light strength is exhibited at opposite sides of a main waveform in a region where the phase of 0° and the phase of 180° meet together, due to light interference. Such light strength is increased if the chromium has a higher light transmittance. As a result, the enhancement in resolution and depth of focus to be obtained by the Half-tone characteristic is inhibited.

FIG. 2D is a sectional view illustrating a photoresist pattern formed on a wafer. It is found that the photoresist pattern has a ghost pattern 6. This ghost pattern 6 is formed by the above-mentioned undesirable light distribution. The depth of ghost pattern 6 increases as the light transmittance of the chromium is increased.

Consequently, where formation of a pattern is carried out using the above-mentioned conventional phase shift mask, there is a problem of formation of an undesirable pattern due to an undesirable light distribution caused by a light interference.

SUMMARY OF THE INVENTION

Therefore, an object of the present invention is to solve the problem encountered in the prior art and, thus, to provide a phase shift mask capable of preventing the formation of a ghost image caused by diffraction and interference generated by light with the phase of 0° and light with the phase of 180° meeting together upon forming a pattern by use of the mask of the Half-tone type, and thereby utilizing a high light transmittance of a chromium film constituting a part of the Half-tone mask.

In accordance with the present invention, this object can be accomplished by providing a phase shift mask comprising a photoresist film pattern having a light transmitting portion and a light shielding portion, and a phase shift layer adapted to shift the phase of light passing through the light transmitting portion of the photoresist film pattern, further comprising: an assistant pattern adapted to remove unnecessary components of a main waveform of the light, which components are formed due to the diffraction of light at opposite sides of the main light waveform.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The present invention will now be described in detail, in conjunction with FIG. 3 and FIGS. 4A to 4D.

The technical principle of the present invention is based on two facts, that is, the first fact that where the light transmitting area is too small, no pattern is formed and the second fact that where light beams with opposite phases are present, the strength of light is reduced due to interference between the light beams.

Figure 1:
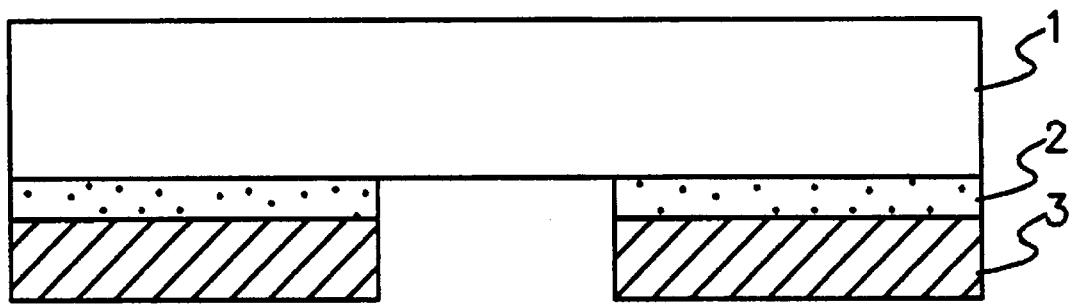
FIG. 1 is a sectional view illustrating a conventional Half-tone phase shift mask.
Figure 2A:
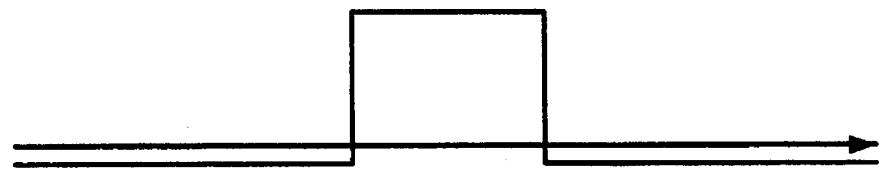
FIG. 2A is a diagram illustrating the distribution of an electric field established just after light passes through the phase shift mask of FIG. 1.
Figure 2B:
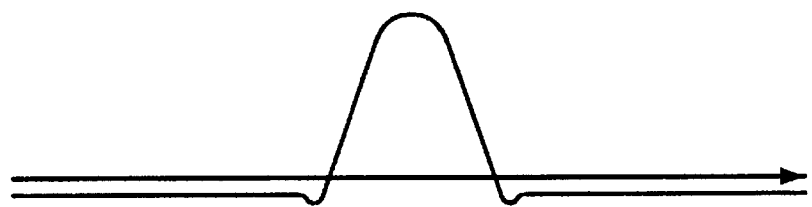
FIG. 2B is a diagram illustrating the distribution of an electric field established when the light passing through the phase shift mask of FIG. 1 reaches a wafer.
Figure 2C:
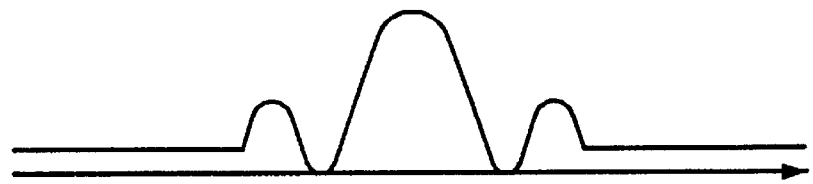
FIG. 2C is a diagram illustrating the distribution of an exposure energy established when the light passing through the phase shift mask of FIG. 1 reaches the wafer.
Figure 2D:
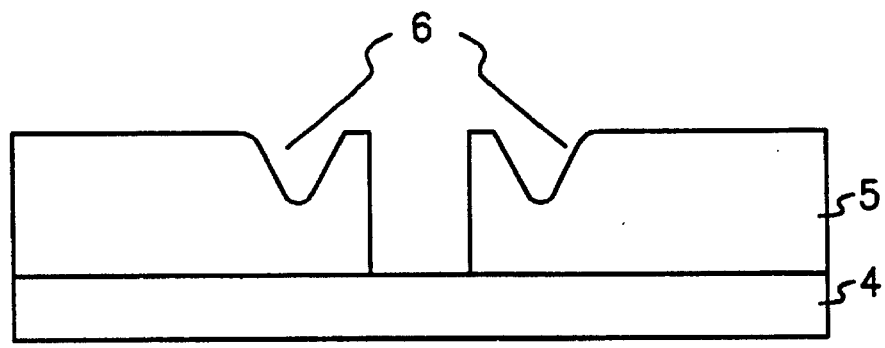
FIG. 2D is a sectional view of a photoresist film pattern formed on the wafer by use of the phase shift mask of FIG. 1.
Figure 3:
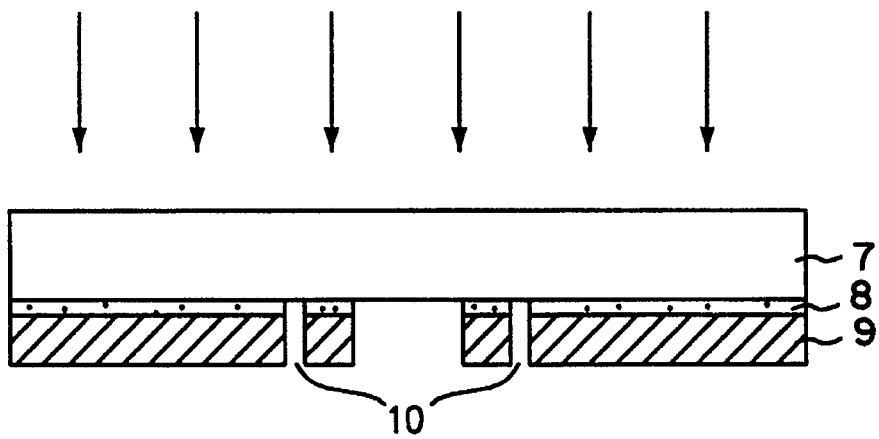
FIG. 3 is a sectional view of a Half-tone type phase shift mask in accordance with the present invention.

FIG. 3 is a sectional view of a Half-tone type phase shift mask in accordance with the present invention. The phase shift mask includes a quartz substrate 7, a chromium film 8 coated on the quartz substrate 7, and a phase shifter 9 coated on the chromium film 8 and made of spin-on-glass or PMMA. In accordance with the present invention, the phase shift mask further includes an assistant pattern 10 formed on a predetermined portion of the chromium film corresponding to a region where a diffraction of light forming a ghost image occurs. The assistant pattern 10 has a dimension capable of preventing a pattern formation at the region where the unnecessary components of the main light waveform are present. The assistant pattern 10 is comprised of a light transmitting layer for shifting the phase of a light incident thereon to 0°. The assistant pattern 10 serves to remove unnecessary components of a main light waveform, which components are formed due to the diffraction of light at opposite sides of the main light waveform.

Figure 4A:
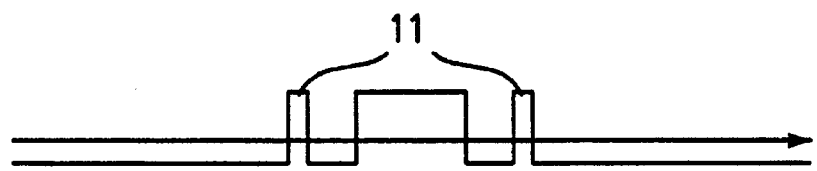
FIG. 4A is a diagram illustrating the distribution of an electric field established just after a light passes through the phase shift mask of FIG. 3.

FIG. 4A is a diagram illustrating the distribution of an electric field established just after a light passes through the phase shift mask of FIG. 3. The assistant pattern 10 of the phase shift mask shifts the phase of the light incident thereon to 0°, and so a waveform 11 with a small quantity of light is obtained.

Figure 4B:
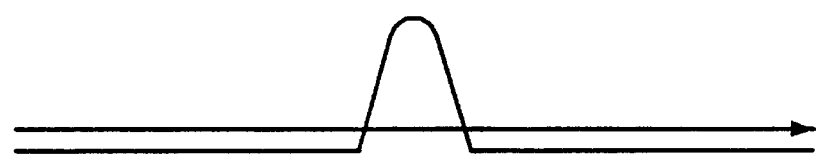
FIG. 4B is a diagram illustrating the distribution of an electric field established when the light passing through the phase shift mask of FIG. 3 reaches a wafer.

FIG. 4B is a diagram illustrating the distribution of an electric field established when the light passing through the phase shift mask of FIG. 3 reaches a wafer. Unnecessary components of the main light waveform, which components are formed due to the diffraction of light at opposite sides of the main light waveform, are removed.

Figure 4C:
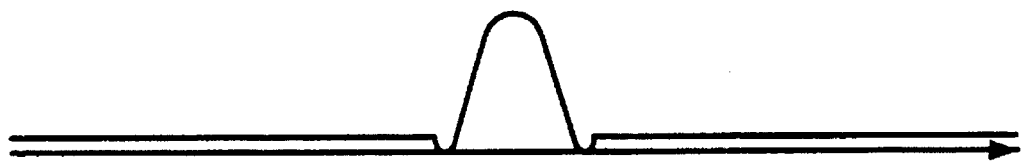
FIG. 4C is a diagram illustrating the distribution of an exposure energy established when the light passing through the phase shift mask of FIG. 3 reaches the wafer.
Figure 4D:
FIG. 4D is a sectional view illustrating a photoresist pattern formed on the wafer by use of the phase shift mask of FIG. 3.

FIG. 4C is a diagram illustrating the distribution of the exposure energy established when the light passing through the phase shift mask of FIG. 3 reaches the wafer. FIG. 4D is a sectional view illustrating a photoresist pattern 14 formed on the wafer 15 by use of the phase shift mask of FIG. 3. The photoresist pattern 4 is a desired pattern free of any ghost image.

As apparent from the above description, the present invention provides a phase shift mask including an assistant pattern capable of avoiding the formation of ghost image caused by diffraction and interferences generated as light with the phase of 0° and light with the phase of 180° meet together upon forming a pattern by use of the mask of the Half-tone type, and thereby utilizing a high light transmittance of a chromium film constituting a part of the Half-tone mask. As a result, it is possible to achieve an enhancement in the resolution and depth of focus.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase shift mask, for forming a pattern in a photosensitive film, comprising:

a transparent substrate;

a light shielding layer disposed on said transparent substrate to form a main light transmitting portion of said transparent substrate for transmitting a main light waveform, and to form an assistant light transmitting portion of said transparent substrate and a phase shifting disposed on said light shielding layer and adapted to shift the phase of light passing through only the light shielding layer;

wherein, light transmitted by said assistant light transmitting portion enterferingly cancels diffractive light components formed at opposite sides of the main light waveform.

2. A phase shift mask in accordance with claim 1, wherein the assistant light transmitting portion shifts a phase of light incident thereon by 0° and the phase shifting layer shifts the phase of light incident thereon by 180°.

3. A phase shift mask in accordance with claim 1, wherein the assistant light transmitting portion is so small as to not form a pattern in the photosensitive film where the diffractive components of the main light waveform are present.

* * * * *